United States Patent
Peng et al.

(10) Patent No.: US 10,129,949 B2
(45) Date of Patent: Nov. 13, 2018

(54) LIGHTING SYSTEM, POWER DRAWING DEVICE USING SINGLE LIVE WIRE AND METHOD FOR CONTROLLING THE SAME

(71) Applicant: Delta Electronics (Shanghai) CO., LTD, Shanghai (CN)

(72) Inventors: Hu Peng, Shanghai (CN); Bo Yang, Shanghai (CN); Tsu-Hua Ai, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 15/654,875

(22) Filed: Jul. 20, 2017

(65) Prior Publication Data
US 2018/0098406 A1    Apr. 5, 2018

(30) Foreign Application Priority Data

Sep. 30, 2016    (CN) .......................... 2016 1 0877017

(51) Int. Cl.
*H05B 37/02*    (2006.01)
*H03K 17/94*    (2006.01)
(Continued)

(52) U.S. Cl.
CPC ......... *H05B 37/0209* (2013.01); *H03K 17/94* (2013.01); *H05B 33/0809* (2013.01);
(Continued)

(58) Field of Classification Search
CPC .......................... H05B 37/02; H05B 37/0209; H05B 37/0227; H05B 39/02; H05B 39/04; H05B 39/06
See application file for complete search history.

(56) References Cited

U.S. PATENT DOCUMENTS 5,336,979 A * 8/1994 Watson ................ H05B 39/086
                                                        315/194
5,519,263 A * 5/1996 Santana, Jr. ....... H05B 37/0209
                                                        307/114
(Continued)

FOREIGN PATENT DOCUMENTS

JP        S56-41999 U     9/1979
JP       2000-106287 A    4/2000
(Continued)

OTHER PUBLICATIONS

The Notice of Allowance issued in the counterpart JP application dated Oct. 2, 2017, by the JPO.
1st Office Action dated Jun. 29, 2017 by the TW Office.

*Primary Examiner* — Jason M Crawford
(74) *Attorney, Agent, or Firm* — Yunling Ren

(57) ABSTRACT

A power drawing device using a single live wire includes a first and second mechanical switches, and a power drawing circuit, wherein the first mechanical switch includes a first contact connected to a live wire, a third contact connected to a first light adjusting circuit, and a fifth contact connected to the first light adjusting circuit; the second mechanical switch includes a first contact connected to the live wire, a third contact connected to a second light adjusting circuit, a fifth contact connected to the second light adjusting circuit, and a sixth contact connected to the first mechanical switch; and the power drawing circuit includes a first terminal connected to the live wire, a second terminal connected to the second mechanical switch, a third terminal connected to the first light adjusting circuit, and a fourth terminal connected to the second light adjusting circuit.

17 Claims, 5 Drawing Sheets

(51) Int. Cl.
*H05B 33/08* (2006.01)
*H05B 39/06* (2006.01)
*H05B 41/36* (2006.01)

(52) U.S. Cl.
CPC ....... *H05B 37/029* (2013.01); *H05B 37/0227* (2013.01); *H05B 39/06* (2013.01); *H05B 41/36* (2013.01)

(56) References Cited

U.S. PATENT DOCUMENTS

| | | | |
|---|---|---|---|
| 6,963,040 B1* | 11/2005 | Urman | H01H 13/023 200/310 |
| 7,855,543 B2* | 12/2010 | Newman, Jr. | G06F 3/03547 307/119 |
| 8,775,829 B2 | 7/2014 | Wang et al. | |
| 2003/0160517 A1 | 8/2003 | Lo et al. | |
| 2008/0258650 A1* | 10/2008 | Steiner | H05B 37/0254 315/291 |
| 2015/0349567 A1* | 12/2015 | Weightman | H05B 37/02 307/52 |

FOREIGN PATENT DOCUMENTS

| | | |
|---|---|---|
| JP | 2004-265713 A | 9/2004 |
| JP | 2009-510667 A | 3/2009 |
| JP | 2009-541937 A | 11/2009 |
| JP | 2014-073019 A | 4/2014 |
| TW | 201233238 A | 8/2012 |
| TW | M501054 U | 5/2015 |
| TW | 201613419 A | 4/2016 |

* cited by examiner

LIGHTING SYSTEM, POWER DRAWING DEVICE USING SINGLE LIVE WIRE AND METHOD FOR CONTROLLING THE SAME

CROSS REFERENCE

This application is based upon and claims priority to Chinese Patent Application No. 201610877017.4, filed on Sep. 30, 2016, the entire contents thereof are incorporated herein by reference.

TECHNICAL FIELD

The present disclosure generally relates to the field of smart home technology, and more particularly, to a lighting system, a power drawing device using a single live wire and a method for controlling the same.

BACKGROUND

With the growing popularity of smart home, a traditional lighting switch needs to be upgraded as a smart lighting switch. However, since most ordinary families employ single live wire cabling, the technology for drawing power using a single live wire is required during replacing the traditional lighting switch by the smart lighting switch.

Current smart lighting switches may be divided into an electronic disconnection type and a complete disconnection type. The electronic disconnection means that aperiodic and proper functional characteristics are achieved by relying on a semiconductor switching device. The complete disconnection means that the proper functionality is achieved by relying on a distance between open contacts, which is comparable to a basic insulation. In a case where the technology for drawing power using a single live wire is applied to the smart lighting switch of the electronic disconnection type, when the switch is off, problems such as flashing or slightly brightness may occur after the lamp is turned off due to the existence of leakage current, and the security is poor.

In the case where the technology for drawing power using a single live wire is applied to the smart lighting switch of the complete disconnection type, although no leakage current exists in the circuit when the switch is off, the power drawing circuit using a single live wire may be only applied to one way of switch. If multiple ways of switch are required, each way of switch is required to have respective power drawing circuits using a single live wire. In addition, the power drawing circuit using a single live wire corresponding to each circuit needs to be output in parallel after being isolated at an output terminal. The cost is relatively high.

It should be noted that, the above information disclosed in this section is only for helping understanding background of the present disclosure. Therefore, it may include information that does not constitute prior art known by those skilled in the art.

SUMMARY

The present disclosure aims to provide a power drawing device using a single live wire and a method for controlling the same, which may overcome, at least to some extent, one or more problems due to limitation and defects of the related art.

According to a first aspect of the present disclosure, there is provided a power drawing device using a single live wire, including:

a first mechanical switch, having a first contact at a first side of the first mechanical switch connected to an input terminal of the live wire, a third contact at a second side of the first mechanical switch connected to a first terminal of a first light adjusting circuit, and a fifth contact at the second side of the first mechanical switch connected to a first output terminal of the live wire and a second terminal of the first light adjusting circuit;

a second mechanical switch, having a first contact at a first side of the second mechanical switch connected to the input terminal of the live wire, a third contact at a second side of the second mechanical switch connected to a first terminal of a second light adjusting circuit, a fifth contact at the second side of the second mechanical switch connected to a second output terminal of the live wire and a second terminal of the second light adjusting circuit, and a sixth contact at the second side of the second mechanical switch connected to a second contact at the first side of the first mechanical switch; and a power drawing circuit, having a first terminal connected to the input terminal of the live wire, a second terminal connected to a second contact at the first side of the second mechanical switch, a third terminal connected to a third terminal of the first light adjusting circuit, and a fourth terminal connected to a third terminal of the second light adjusting circuit.

In one exemplary embodiment of the present disclosure, both the first mechanical switch and the second mechanical switch are double-pole double-throw mechanical switches.

In one exemplary embodiment of the present disclosure, when both the first mechanical switch and the second mechanical switch are off, the first contact at the first side of the first mechanical switch is connected to a fourth contact at the second side of the first mechanical switch, the second contact at the first side of the first mechanical switch is connected to a sixth contact at the second side of the first mechanical switch, the first contact at the first side of the second mechanical switch is connected to a fourth contact at the second side of the second mechanical switch, and the second contact at the first side of the second mechanical switch is connected to the sixth contact at the second side of the second mechanical switch.

In one exemplary embodiment of the present disclosure, when the first mechanical switch is on and the second mechanical switch is off, the first contact at the first side of the first mechanical switch is connected to the third contact at the second side of the first mechanical switch, the second contact at the first side of the first mechanical switch is connected to the fifth contact at the second side of the first mechanical switch, the first contact at the first side of the second mechanical switch is connected to a fourth contact at the second side of the second mechanical switch, and the second contact at the first side of the second mechanical switch is connected to the sixth contact at the second side of the second mechanical switch.

In one exemplary embodiment of the present disclosure, when the first mechanical switch is off and the second mechanical switch is on, the first contact at the first side of the first mechanical switch is connected to a fourth contact at the second side of the first mechanical switch, the second contact at the first side of the first mechanical switch is connected to a sixth contact at the second side of the first mechanical switch, the first contact at the first side of the second mechanical switch is connected to the third contact at the second side of the second mechanical switch, and the second contact at the first side of the second mechanical switch is connected to the fifth contact at the second side of the second mechanical switch.

In one exemplary embodiment of the present disclosure, when both the first mechanical switch and the second mechanical switch are on, the first contact at the first side of the first mechanical switch is connected to the third contact at the second side of the first mechanical switch, the second contact at the first side of the first mechanical switch is connected to the fifth contact at the second side of the first mechanical switch, the first contact at the first side of the second mechanical switch is connected to the third contact at the second side of the second mechanical switch, and the second contact at the first side of the second mechanical switch is connected to the fifth contact at the second side of the second mechanical switch.

In one exemplary embodiment of the present disclosure, the first output terminal of the live wire is connected to a first lamp, and the second output terminal of the live wire is connected to a second lamp.

In one exemplary embodiment of the present disclosure, both the first light adjusting circuit and the second light adjusting circuit are silicon controlled circuits.

According to a second aspect of the present disclosure, there is provided a method for controlling the power drawing device using a single live wire according to the first aspect of the present disclosure, including:

controlling the first contact at the first side of the first mechanical switch to be connected to a fourth contact at the second side of the first mechanical switch, controlling the second contact at the first side of the first mechanical switch to be connected to a sixth contact at the second side of the first mechanical switch, controlling the first contact at the first side of the second mechanical switch to be connected to a fourth contact at the second side of the second mechanical switch, and controlling the second contact at the first side of the second mechanical switch to be connected to the sixth contact at the second side of the second mechanical switch; or controlling the first contact at the first side of the first mechanical switch to be connected to the third contact at the second side of the first mechanical switch, controlling the second contact at the first side of the first mechanical switch to be connected to the fifth contact at the second side of the first mechanical switch, controlling the first contact at the first side of the second mechanical switch to be connected to a fourth contact at the second side of the second mechanical switch, and controlling the second contact at the first side of the second mechanical switch to be connected to the sixth contact at the second side of the second mechanical switch; or controlling the first contact at the first side of the first mechanical switch to be connected to a fourth contact at the second side of the first mechanical switch, controlling the second contact at the first side of the first mechanical switch to be connected to a sixth contact at the second side of the first mechanical switch, controlling the first contact at the first side of the second mechanical switch to be connected to the third contact at the second side of the second mechanical switch, and controlling the second contact at the first side of the second mechanical switch to be connected to the fifth contact at the second side of the second mechanical switch; or controlling the first contact at the first side of the first mechanical switch to be connected to a third contact at the second side of the first mechanical switch, controlling the second contact at the first side of the first mechanical switch to be connected to a fifth contact at the second side of the first mechanical switch, controlling the first contact at the first side of the second mechanical switch to be connected to the third contact at the second side of the second mechanical switch, and controlling the second contact at the first side of the second mechanical switch to be connected to the fifth contact at the second side of the second mechanical switch.

According to a third aspect of the present disclosure, there is provided a lighting system, including any one of the above power drawing devices using a single live wire.

According to the power drawing device and method using a single live wire provided by exemplary embodiments of the present disclosure, one power drawing circuit using a single live wire and two mechanical switches are employed. The power drawing circuit draws power from only one of the two mechanical switches when it works, which enables the two switches to draw power using a single live wire. On the one hand, one way of power drawing circuit using a single live wire is employed in the case of two ways of switches, which may omit another way of power drawing circuit using a single live wire; on the other hand, because there is only one way of power drawing circuit using a single live wire and the power drawing circuit using a single live wire draws power from only one mechanical switch, thus, two ways of isolation circuits may be omitted; on another hand, since one way of power drawing circuit using a single live wire and two ways of insolating circuits are omitted, cost may be saved and product size may be reduced.

It should be understood that the above general description and the detailed description below are merely exemplary and explanatory, and do not limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure. It should be appreciated that the drawings in the following description are some embodiments of the present disclosure only, and those ordinary skilled in the art may obtain other drawings form these drawings without creative labors.

DETAILED DESCRIPTION

Figure 1:
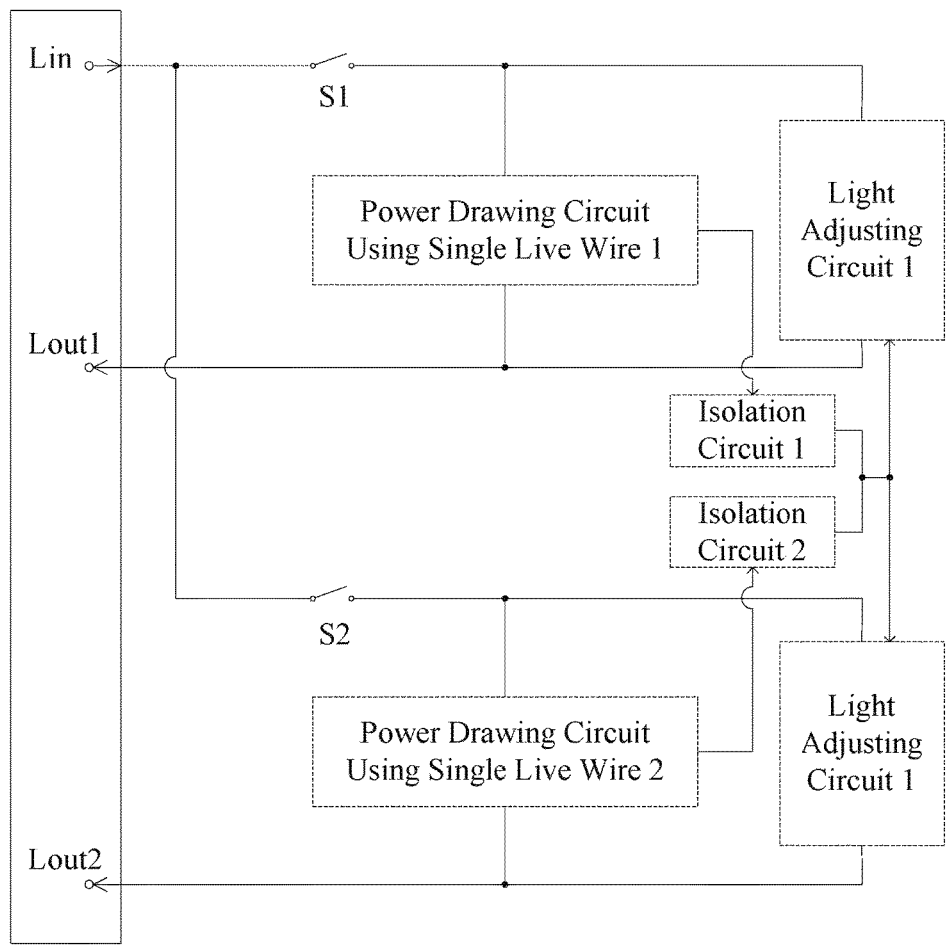
FIG. 1 shows a schematic diagram of a power drawing device using a single live wire which adopts a single-pole single-throw switch.

Example implementations will now be described in further detail with reference to the accompanying drawings.

The example embodiments, however, may be embodied in various forms, and should not be construed as being limited to the implementations set forth herein. Rather, these embodiments are provided so that the present invention will become thorough and complete, and will fully convey the concept of the inventive concept to those skilled in the art. The described features, structures or characters may be combined in one or more embodiments in any suitable manner. In the following description, numerous specific details are provided so as to allow a full understanding of the embodiments of the present disclosure. However, those skilled in the art will recognize that the technical solutions of the present disclosure may be implemented without one or more of the specific details, or other methods, components, devices, steps and so on may be used. In other cases, the well-known technical solution is not shown or described in detail to avoid obscuring various aspects of the present disclosure.

In addition, the accompanying drawings are only schematic illustration of the present disclosure, and may be not drawn to scale. In the drawings, the same reference numerals denote the same or similar parts, thus their detailed description will be omitted. The blocks illustrated in the drawings are functional entities, which do not necessarily correspond to physical or logical independent entities. The above functional entities may be implemented in the form of software, or in one or more hardware modules or integrated circuits, or in different networks and/or processing devices and/or microcontroller devices.

In a technical solution including two ways of smart lighting switches in a complete disconnection type, single-pole single-throw switches are adopted. For example, FIG. 1 shows a schematic diagram of a power drawing device using a single live wire which adopts a single-pole single-throw switch in the technical solution.

As shown in FIG. 1, the mechanical switch S1 and the mechanical switch S2 work independently of each other, and two separate sets of power drawing circuits using a single live wire are required. In addition, when both the mechanical switch S1 and the mechanical switch S2 are on, a power drawing circuit 1 using a single live wire and a power drawing circuit 2 using a single live wire will work at the same time, so controlling of a light adjusting circuit 1 and a light adjusting circuit 2 may be interfered with each other. Thus, in order to control the light adjusting circuits better, an isolation circuit 1 and an isolation circuit 2 need to be provided, such that the two power drawing circuits using a single live wire can be isolated from each other and then output in parallel after isolation.

The following Table 1 shows corresponding states of the mechanical switches and working states of the power drawing circuits using a single live wire according to the power drawing device using a single live wire as shown in FIG. 1.

TABLE 1

| state of the mechanical switch | working state of the power drawing circuit using a single live wire |
|---|---|
| mechanical switch S1 OFF mechanical switch S2 OFF | Neither works |
| mechanical switch S1 ON mechanical switch S2 OFF | power drawing circuit 1 works to draw power from the mechanical switch S1; power drawing circuit 2 does not work |
| mechanical switch S1 OFF mechanical switch S2 ON | power drawing circuit 1 does not work; power drawing circuit 2 works to draw power from the mechanical switch S2; |

TABLE 1-continued

| state of the mechanical switch | working state of the power drawing circuit using a single live wire |
|---|---|
| mechanical switch S1 ON mechanical switch S2 ON | both power drawing circuits 1 and 2 work and output in parallel after isolation |

It can be seen that, in order to make that the power drawing device using a single live wire as shown in FIG. 1 may normally work under the above four switch states of the mechanical switch S1 and the mechanical switch S2, two sets of power drawing circuits using a single live wire and two sets of isolation circuits are required, which results in large size of the power drawing device using a single live wire and high cost.

Figure 2:
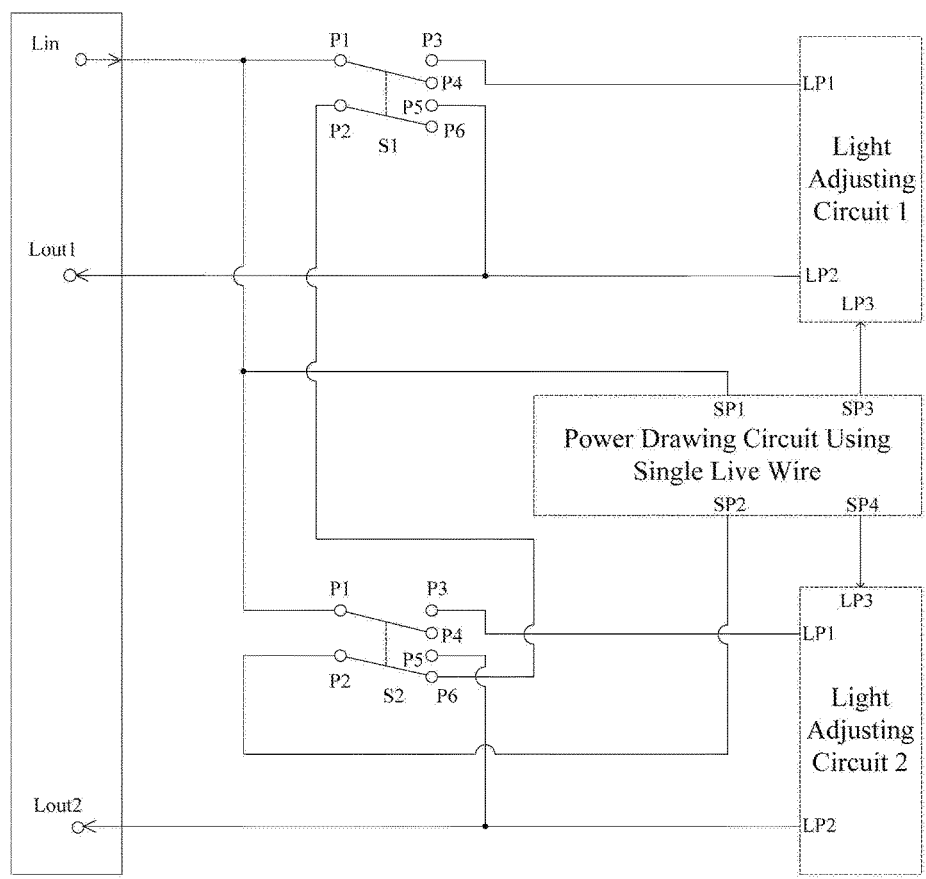
FIG. 2 shows a schematic diagram of a power drawing device using a single live wire according to an exemplary embodiment of the present disclosure.

In the present exemplary embodiment, a power drawing device using a single live wire is provided. Referring to FIG. 2, the power drawing device using a single live wire includes a mechanical switch S1, a mechanical switch S2 and a power drawing circuit using a single live wire.

In the embodiment, the mechanical switch S11 includes a first contact P1 at a first side (a left side of the mechanical switch S1 as shown in FIG. 2), a second contact P2 at the first side, and a third contact P3, a fourth contact P4, a fifth contact P5 and a sixth contact P6 at a second side (a right side of the mechanical switch S1 as shown in FIG. 2). In the embodiment, the first contact P1 at the first side of the mechanical switch S1 is connected to an input terminal Lin of a live wire, the second contact P2 at the first side of the mechanical switch S is connected to a sixth contact at a second side of the mechanical switch S2, the third contact P3 at the second side of the mechanical switch S1 is connected to a first terminal LP1 of a light adjusting circuit 1, and a fifth contact P5 at the second side of the mechanical switch S1 is connected to a first output terminal Lout1 of the live wire and a second terminal LP2 of the light adjusting circuit 1.

The mechanical switch S2 includes: a first contact P1 at a first side (a left side of the mechanical switch S2 as shown in FIG. 2), a second contact P2 at the first side, and a third contact P3, a fourth contact P4, a fifth contact P5 and a sixth contact P6 at a second side (a right side of the mechanical switch S2 as shown in FIG. 2). In the embodiment, the first contact P1 at the first side of the mechanical switch S2 is connected to the input terminal Lin of a live wire, the second contact P2 at the first side of the mechanical switch S2 is connected to a second terminal SP2 of the power drawing circuit using a single live wire, the third contact P3 at the second side of the mechanical switch S2 is connected to a first terminal LP1 of a light adjusting circuit 2, a fifth contact P5 at the second side of the mechanical switch S2 is connected to a second output terminal Lout2 of the live wire and a second terminal LP2 of the light adjusting circuit 2, and the sixth contact P6 at the second side of the mechanical switch S2 is connected to the second contact P2 at the first side of the mechanical switch S1.

In the present exemplary embodiment, the power drawing circuit using a single live wire includes a first terminal SP1, a second terminal SP2, a third terminal SP3 and a fourth terminal SP4. In the present exemplary implementation, the first terminal SP1 of the power drawing circuit is connected to the input terminal Lin of the live wire, the second terminal SP2 of the power drawing circuit is connected to the second contact P2 at the first side of the mechanical switch S2, the third terminal SP3 of the power drawing circuit is connected to a third terminal LP3 of the light adjusting circuit 1, and the fourth terminal SP4 of the power drawing circuit is connected to a third terminal LP3 of the light adjusting circuit 2.

Further, as shown in FIG. 2, taking that both the mechanical switch S1 and the mechanical switch S2 are double-pole double-throw mechanical switches as an example, when and only when one way of mechanical switch is on, the power drawing circuit may be switched on and start working along with the mechanical switch which is on. When both the mechanical switch S1 and the mechanical switch S2 are on, the power drawing circuit may be connected only at the mechanical switch S2 and start working. At this time, the power drawing circuit is not connected with the mechanical switch S1, therefore, outputting in parallel after isolation is no longer needed.

The following Table 2 shows corresponding states of the mechanical switches and working states of the power drawing circuits according to the power drawing device using a single live wire as shown in the present exemplary embodiment.

TABLE 2

| state of the mechanical switch | working state of the power drawing circuit using a single live wire |
| --- | --- |
| mechanical switch S1 OFF mechanical switch S2 OFF | not working |
| mechanical switch S1 ON mechanical switch S2 OFF | the power drawing circuit works to draw power from the mechanical switch S1 |
| mechanical switch S1 OFF mechanical switch S2 ON | the power drawing circuit works to draw power from the mechanical switch S2 |
| mechanical switch S1 ON mechanical switch S2 ON | the power drawing circuit works to draw power from the mechanical switch S2 |

It can be seen from Table 2 that, through the technical solution according to the present exemplary embodiment, the power drawing circuit using a single live wire may operate normally under the corresponding four states of the mechanical switches.

In conclusion, according to the power drawing device using a single live wire provided by the present exemplary embodiment, in the case of a smart lighting switch of the complete disconnection type, one power drawing circuit using a single live wire and two mechanical switches are employed. The power drawing circuit using a single live wire draws power from only one of the two mechanical switches when works, which enables the two switches to draw power using a single live wire. On the one hand, one way of power drawing circuit is employed in the case of two ways of switches, which may omit another way of power drawing circuit; on the other hand, because there is only one way of power drawing circuit and the power drawing circuit draws power from only one mechanical switch, two ways of isolation circuits may be omitted; on another hand, since one way of power drawing circuit and two ways of isolation circuits are omitted, cost may be saved and product size may be reduced.

Further, in the present exemplary embodiment, the manner for drawing power employed by the power drawing circuit may include manners of drawing power using transformer power supply changeover or employing a single live wire power supply module with micro power consumption. However, the manner for drawing power using a single live wire according to the exemplary embodiment of the present disclosure is not limited thereto, various manners for drawing power which can achieve the function of drawing power using a single live wire may fall within the scope of the present invention. For example, as for power drawing using transformer power supply changeover, a loop current may be rectified firstly, and DC-DC conversion is then conducted by an electronic transformer to obtain DC current as the control current. The single live wire power supply module with micro power consumption may include a single live wire power drawing module PI-3V3-B4, a single live wire power drawing module PI-05V-D4, and a single live wire power drawing module PI-05V-P4. However, the single live wire power drawing module according to the exemplary embodiment of the present disclosure is not limited thereto. For example, it may also include single live wire power drawing modules PI-03V-P4, PI-05V-B3, and the like.

In the present exemplary embodiment, the first output terminal Lout1 of the live wire may be connected to a first lamp, and the second output terminal Lout2 of the live wire may be connected to a second lamp. The first lamp and the second lamp may be incandescent lamps, energy saving lamps, LED lights and other loads. It will be readily appreciated that, in other exemplary embodiments of the present disclosure, the first output terminal Lout1 of the live wire and the second output terminal Lout2 of the live wire may also be connected to other types of loads, which also falls within the protection scope of the present disclosure.

Further, both the above light adjusting circuit 1 and the light adjusting circuit 2 may be silicon controlled circuits. In the present exemplary embodiment, the luminance of the lamp may be adjusted by controlling a conduction angle of a silicon controlled rectifier (SCR) through the power drawing circuit. However, the light adjusting circuit according to the exemplary embodiment of present disclosure is not limited thereto. For example, the light adjusting circuit may also be a controllable relay, a dedicated control IC, or the like.

Referring to FIGS. 2-5, working states of the power drawing circuit using a single live wire according to the present embodiment will be described as follows in more detail.

FIG. 2 shows a switch state that both the mechanical switch S1 and the mechanical switch S2 are off according to the power drawing device using a single live wire.

As shown in FIG. 2, when both the mechanical switch S1 and the mechanical switch S2 are off, the first contact P1 at the first side of the mechanical switch S1 is connected to a fourth contact SP4 at the second side of the mechanical switch S1, the second contact P2 at the first side of the mechanical switch S1 is connected to a sixth contact P6 at the second side of the mechanical switch S1, the first contact P1 at the first side of the mechanical switch S2 is connected to a fourth contact SP4 at the second side of the mechanical switch S2, and the second contact P2 at the first side of the mechanical switch S2 is connected to the sixth contact P6 at the second side of the mechanical switch S2.

It can be seen from FIG. 2 that, among the first terminal SP1 to the fourth terminal SP4 of the power drawing circuit using a single live wire, only the first terminal SP1 is connected to the input terminal Lin of the live wire, none of the left three terminals is connected to the output terminal of the live wire. Therefore, the power drawing circuit using a single live wire does not draw power to work under this switch state.

Figure 3:
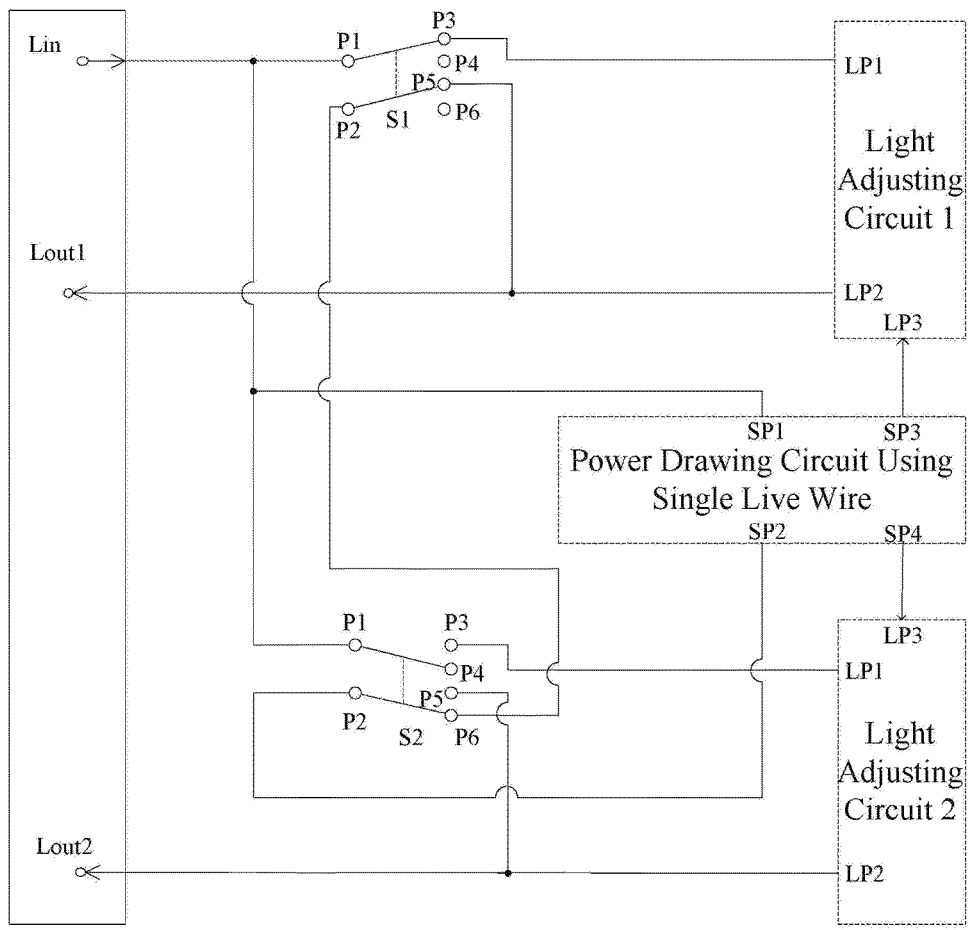
FIG. 3 shows a schematic diagram of a switch state that a first mechanical switch is on and a second mechanical switch is off according to the power drawing device using a single live wire as shown in FIG. 2.

FIG. 3 shows a schematic diagram of a switch state that the mechanical switch S1 is on and the mechanical switch S2 is off according to the power drawing device using a single live wire as shown in FIG. 2.

As shown in FIG. 3, when the mechanical switch S1 is on and the mechanical switch S2 is off, the first contact P1 at the first side of the mechanical switch S1 is connected to the third contact P3 at the second side of the mechanical switch S1, the second contact P2 at the first side of the mechanical switch S1 is connected to the fifth contact P5 at the second side of the mechanical switch S1, the first contact P1 at the first side of the mechanical switch S2 is connected to a fourth contact SP4 at the second side of the mechanical switch S2, and the second contact P2 at the first side of the mechanical switch S2 is connected to the sixth contact P6 at the second side of the mechanical switch S2.

It can be seen from FIG. 3 that, the first terminal SP1 of the power drawing circuit is connected to the input terminal Lin of the live wire, and the second terminal SP2 of the power drawing circuit is connected to the second contact P2 and the fifth contact P5 of the mechanical switch S1 via the second contact P2 and the sixth contact P6 of the mechanical switch S2. Since the fifth contact P5 of the mechanical switch S1 is connected to the output terminal Lout1 of the live wire, the second terminal SP2 of the power drawing circuit using a single live wire is connected to the output terminal Lout1 of the live wire. Therefore, the power drawing circuit using a single live wire may work to draw power from the mechanical switch S1.

Figure 4:
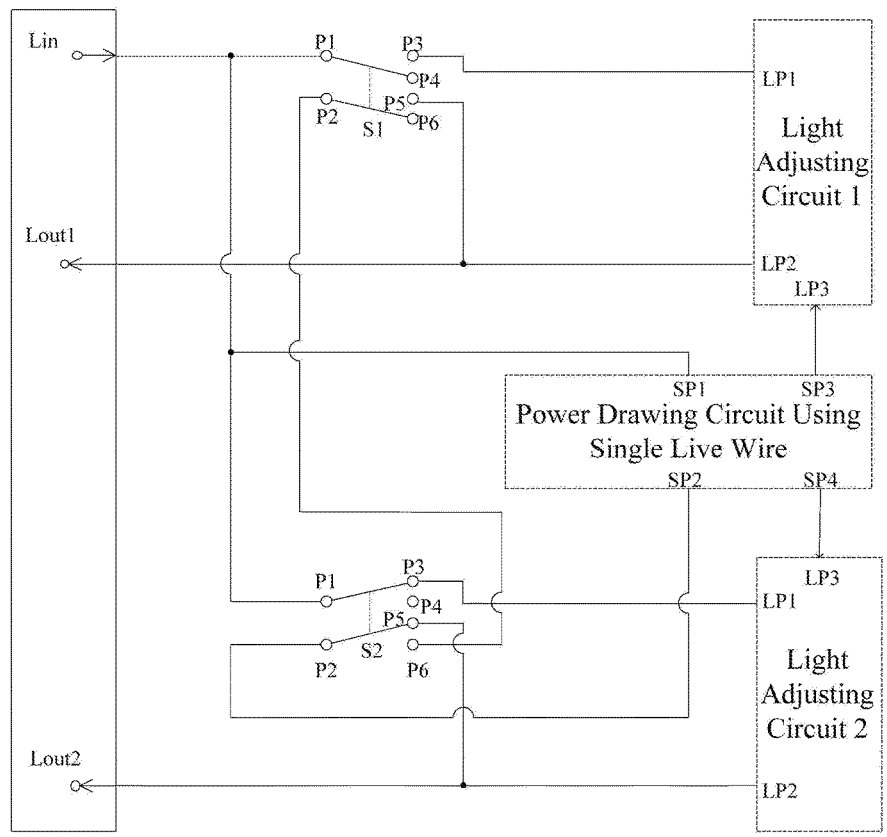
FIG. 4 shows a schematic diagram of a switch state that a first mechanical switch is off and a second mechanical switch is on according to the power drawing device using a single live wire as shown in FIG. 2.

FIG. 4 shows a schematic diagram of a switch state that the mechanical switch S1 is off and the mechanical switch S2 is on according to the power drawing device using a single live wire as shown in FIG. 2.

As shown in FIG. 4, when the mechanical switch S1 is off and the mechanical switch S2 is on, the first contact P1 at the first side of the mechanical switch S1 is connected to a fourth contact SP4 at the second side of the mechanical switch S1, the second contact P2 at the first side of the mechanical switch S1 is connected to a sixth contact P6 at the second side of the mechanical switch S1, the first contact P1 at the first side of the mechanical switch S2 is connected to the third contact P3 at the second side of the mechanical switch S2, and the second contact P2 at the first side of the mechanical switch S2 is connected to the fifth contact P5 at the second side of the mechanical switch S2.

It can be seen from FIG. 4 that, the first terminal SP1 of the power drawing circuit is connected to the input terminal Lin of the live wire, and the second terminal SP2 of the power drawing circuit is connected to the fifth contact P5 of the mechanical switch S2 via the second contact P2 of the mechanical switch S2. Since the fifth contact P5 of the mechanical switch S2 is connected to the output terminal Lout2 of the live wire, the second terminal SP2 of the power drawing circuit using a single live wire is connected to the output terminal Lout2 of the live wire. Therefore, the power drawing circuit using a single live wire may work to draw power from the mechanical switch S2.

Figure 5:
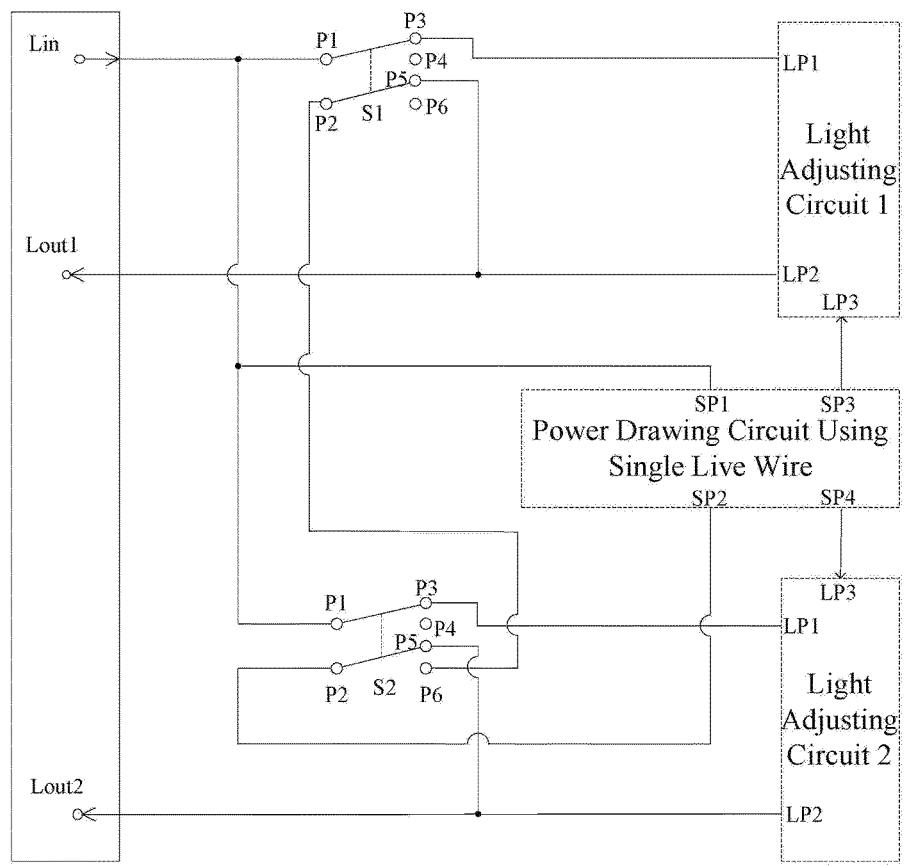
FIG. 5 shows a schematic diagram of a switch state that both a first mechanical switch and a second mechanical switch of the device are on according to the power drawing device using a single live wire as shown in FIG. 2.

FIG. 5 shows a schematic diagram of a switch state that both the mechanical switch S1 and the mechanical switch S2 are on according to the power drawing device using a single live wire as shown in FIG. 2.

As shown in FIG. 5, when both the mechanical switch S1 and the mechanical switch S2 are on, the first contact P1 at the first side of the mechanical switch S1 is connected to the third contact P3 at the second side of the mechanical switch S1, the second contact P2 at the first side of the mechanical switch S1 is connected to the fifth contact P5 at the second side of the mechanical switch S1, the first contact P1 at the first side of the mechanical switch S2 is connected to the third contact P3 at the second side of the mechanical switch S2, and the second contact P2 at the first side of the mechanical switch S2 is connected to the fifth contact P5 at the second side of the mechanical switch S2.

It can be seen from FIG. 5 that, when both the mechanical switch S1 and the mechanical switch S2 are on, it is similar to FIG. 4 that the first terminal SP of the power drawing circuit is connected to the input terminal Lin of the live wire, and the second terminal SP2 of the power drawing circuit is connected to the fifth contact P5 of the mechanical switch S2 via the second contact P2 of the mechanical switch S2. Since the fifth contact P5 of the mechanical switch S2 is connected to the output terminal Lout2 of the live wire, the second terminal SP2 of the power drawing circuit is connected to the output terminal Lout2 of the live wire. Therefore, the power drawing circuit using a single live wire may work to draw power from the mechanical switch S2.

Further, when both the mechanical switch S1 and the mechanical switch S2 are on, because the second terminal SP2 of the power drawing circuit is not connected to the mechanical switch S1, working of a loop of the mechanical switch S1 will not interfere with a loop of the power drawing circuit. No isolation circuit is needed.

In conclusion, corresponding states of the mechanical switches and working states of the power drawing circuits according to the power drawing device using a single live wire as shown in the present exemplary embodiment may be summarized in the following Table 3.

TABLE 3

| state of the mechanical switch | working state of the power drawing circuit using a single live wire |
| --- | --- |
| mechanical switch S1 OFF<br>mechanical switch S2 OFF | does not work (Lin is not connected to either Lout1 or Lout2) |
| mechanical switch S1 ON<br>mechanical switch S2 OFF | the power drawing circuit works to draw power from the mechanical switch S1 (Lin is connected with Lout1) |
| mechanical switch S1 OFF<br>mechanical switch S2 ON | the power drawing circuit works to draw power from the mechanical switch S2 (Lin is connected with Lout2) |
| mechanical switch S1 ON<br>mechanical switch S2 ON | the power drawing circuit works to draw power from the mechanical switch S2 (Lin is connected with Lout2) |

Further, the present exemplary embodiment further provides a method for controlling the power drawing device using a single live wire as shown in FIG. 2. The method may include following steps.

In an embodiment, it is controlled that the first contact P1 at the first side of the mechanical switch S1 is connected to a fourth contact P4 at the second side of the mechanical switch S1, the second contact P2 at the first side of the mechanical switch S1 is connected to a sixth contact P6 at the second side of the mechanical switch S1, the first contact P1 at the first side of the mechanical switch S2 is connected to a fourth contact P4 at the second side of the mechanical switch S2, and the second contact P2 at the first side of the mechanical switch S2 is connected to the sixth contact P6 at the second side of the mechanical switch S2.

In another embodiment, it is controlled that the first contact P1 at the first side of the mechanical switch S1 is connected to the third contact P3 at the second side of the mechanical switch S1, the second contact P2 at the first side of the mechanical switch S1 is connected to the fifth contact P5 at the second side of the mechanical switch S1, the first contact P1 at the first side of the mechanical switch S2 is connected to a fourth contact P4 at the second side of the mechanical switch S2, and the second contact P2 at the first side of the mechanical switch S2 is connected to the sixth contact P6 at the second side of the mechanical switch S2.

In still another embodiment, it is controlled that the first contact P1 at the first side of the mechanical switch S1 is connected to a fourth contact P4 at the second side of the mechanical switch S1, the second contact P2 at the first side of the mechanical switch S is connected to a sixth contact P6 at the second side of the mechanical switch S1, the first contact P1 at the first side of the mechanical switch S2 is connected to the third contact P3 at the second side of the mechanical switch S2, and the second contact P2 at the first side of the mechanical switch S2 is connected to the fifth contact P5 at the second side of the mechanical switch S2.

In yet another embodiment, it is controlled that the first contact P1 at the first side of the mechanical switch S1 is connected to a third contact P3 at the second side of the mechanical switch S1, the second contact P2 at the first side of the mechanical switch S1 is connected to a fifth contact P5 at the second side of the mechanical switch S1, the first contact P1 at the first side of the mechanical switch S2 is connected to the third contact P3 at the second side of the mechanical switch S2, and the second contact P2 at the first side of the mechanical switch S2 is connected to the fifth contact P5 at the second side of the mechanical switch.

Further, another exemplary embodiment of the present disclosure provides a lighting system, including any one of the power drawing devices using a single live wire according to the above mentioned embodiments. In addition, the lighting system may also include a light adjusting circuit 1 and a light adjusting circuit 2. Both the light adjusting circuit 1 and the light adjusting circuit 2 may be silicon controlled circuits. However, the light adjusting circuit according to the exemplary embodiment of present disclosure is not limited thereto. For example, the light adjusting circuit may also be a controllable relay, a dedicated control IC, or the like. Since the lighting system in the present exemplary implementation employs the above power drawing device using a single live wire, it at least has full advantages corresponding to the power drawing device using a single live wire.

Other embodiments of the present disclosure will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present disclosure is not limited to the exact construction that has been described above and illustrated in the accompanying drawings, and that various modifications and changes can be made without departing from the scope thereof. It is intended that the scope of the invention only be limited by the appended claims.

What is claimed is:

1. A power drawing device using a single live wire, comprising:
    a first mechanical switch, having a first contact at a first side of the first mechanical switch connected to an input terminal of the live wire, a third contact at a second side of the first mechanical switch connected to a first terminal of a first light adjusting circuit, and a fifth contact at the second side of the first mechanical switch connected to a first output terminal of the live wire and a second terminal of the first light adjusting circuit;
    a second mechanical switch, having a first contact at a first side of the second mechanical switch connected to the input terminal of the live wire, a third contact at a second side of the second mechanical switch connected to a first terminal of a second light adjusting circuit, a fifth contact at the second side of the second mechanical switch connected to a second output terminal of the live wire and a second terminal of the second light adjusting circuit, and a sixth contact at the second side of the second mechanical switch connected to a second contact at the first side of the first mechanical switch; and
    a power drawing circuit, having a first terminal connected to the input terminal of the live wire, a second terminal connected to a second contact at the first side of the second mechanical switch, a third terminal connected to a third terminal of the first light adjusting circuit, and a fourth terminal connected to a third terminal of the second light adjusting circuit.

2. The power drawing device according to claim 1, wherein both the first mechanical switch and the second mechanical switch are double-pole double-throw mechanical switches.

3. The power drawing device according to claim 1, wherein when both the first mechanical switch and the second mechanical switch are off, the first contact at the first side of the first mechanical switch is connected to a fourth contact at the second side of the first mechanical switch, the second contact at the first side of the first mechanical switch is connected to a sixth contact at the second side of the first mechanical switch, the first contact at the first side of the second mechanical switch is connected to a fourth contact at the second side of the second mechanical switch, and the second contact at the first side of the second mechanical switch is connected to the sixth contact at the second side of the second mechanical switch.

4. The power drawing device according to claim 1, wherein when the first mechanical switch is on and the second mechanical switch is off, the first contact at the first side of the first mechanical switch is connected to the third contact at the second side of the first mechanical switch, the second contact at the first side of the first mechanical switch is connected to the fifth contact at the second side of the first mechanical switch, the first contact at the first side of the second mechanical switch is connected to a fourth contact at the second side of the second mechanical switch, and the second contact at the first side of the second mechanical switch is connected to the sixth contact at the second side of the second mechanical switch.

5. The power drawing device according to claim 1, wherein when the first mechanical switch is off and the second mechanical switch is on, the first contact at the first side of the first mechanical switch is connected to a fourth contact at the second side of the first mechanical switch, the second contact at the first side of the first mechanical switch is connected to a sixth contact at the second side of the first mechanical switch, the first contact at the first side of the second mechanical switch is connected to the third contact at the second side of the second mechanical switch, and the second contact at the first side of the second mechanical switch is connected to the fifth contact at the second side of the second mechanical switch.

6. The power drawing device according to claim 1, wherein when both the first mechanical switch and the second mechanical switch are on, the first contact at the first side of the first mechanical switch is connected to the third contact at the second side of the first mechanical switch, the second contact at the first side of the first mechanical switch is connected to the fifth contact at the second side of the first mechanical switch, the first contact at the first side of the second mechanical switch is connected to the third contact at the second side of the second mechanical switch, and the second contact at the first side of the second mechanical switch is connected to the fifth contact at the second side of the second mechanical switch.

7. The power drawing device according to claim 1, wherein the first output terminal of the live wire is connected to a first lamp, and the second output terminal of the live wire is connected to a second lamp.

8. The power drawing device according to claim 1, wherein both the first light adjusting circuit and the second light adjusting circuit are silicon controlled circuits.

9. A method for controlling a power drawing device using a single live wire, the power drawing device comprising:
  a first mechanical switch, having a first contact at a first side of the first mechanical switch connected to an input terminal of the live wire, a third contact at a second side of the first mechanical switch connected to a first terminal of a first light adjusting circuit, and a fifth contact at the second side of the first mechanical switch connected to a first output terminal of the live wire and a second terminal of the first light adjusting circuit;
  a second mechanical switch, having a first contact at a first side of the second mechanical switch connected to the input terminal of the live wire, a third contact at a second side of the second mechanical switch connected to a first terminal of a second light adjusting circuit, a fifth contact at the second side of the second mechanical switch connected to a second output terminal of the live wire and a second terminal of the second light adjusting circuit, and a sixth contact at the second side of the second mechanical switch connected to a second contact at the first side of the first mechanical switch; and
  a power drawing circuit, having a first terminal connected to the input terminal of the live wire, a second terminal connected to a second contact at the first side of the second mechanical switch, a third terminal connected to a third terminal of the first light adjusting circuit, and a fourth terminal connected to a third terminal of the second light adjusting circuit;
  wherein the method comprises:
  controlling the first contact at the first side of the first mechanical switch to be connected to a fourth contact at the second side of the first mechanical switch, controlling the second contact at the first side of the first mechanical switch to be connected to a sixth contact at the second side of the first mechanical switch, controlling the first contact at the first side of the second mechanical switch to be connected to a fourth contact at the second side of the second mechanical switch, and controlling the second contact at the first side of the second mechanical switch to be connected to the sixth contact at the second side of the second mechanical switch; or
  controlling the first contact at the first side of the first mechanical switch to be connected to the third contact at the second side of the first mechanical switch, controlling the second contact at the first side of the first mechanical switch to be connected to the fifth contact at the second side of the first mechanical switch, controlling the first contact at the first side of the second mechanical switch to be connected to a fourth contact at the second side of the second mechanical switch, and controlling the second contact at the first side of the second mechanical switch to be connected to the sixth contact at the second side of the second mechanical switch; or
  controlling the first contact at the first side of the first mechanical switch to be connected to a fourth contact at the second side of the first mechanical switch, controlling the second contact at the first side of the first mechanical switch to be connected to a sixth contact at the second side of the first mechanical switch, controlling the first contact at the first side of the second mechanical switch to be connected to the third contact at the second side of the second mechanical switch, and controlling the second contact at the first side of the second mechanical switch to be connected to the fifth contact at the second side of the second mechanical switch; or
  controlling the first contact at the first side of the first mechanical switch to be connected to a third contact at the second side of the first mechanical switch, controlling the second contact at the first side of the first mechanical switch to be connected to a fifth contact at the second side of the first mechanical switch, controlling the first contact at the first side of the second mechanical switch to be connected to the third contact at the second side of the second mechanical switch, and controlling the second contact at the first side of the second mechanical switch to be connected to the fifth contact at the second side of the second mechanical switch.

10. A lighting system, comprising a power drawing device using a single live wire, wherein the power drawing device comprises:
  a first mechanical switch, having a first contact at a first side of the first mechanical switch connected to an input terminal of the live wire, a third contact at a second side of the first mechanical switch connected to a first terminal of a first light adjusting circuit, and a fifth contact at the second side of the first mechanical switch connected to a first output terminal of the live wire and a second terminal of the first light adjusting circuit;
  a second mechanical switch, having a first contact at a first side of the second mechanical switch connected to the input terminal of the live wire, a third contact at a second side of the second mechanical switch connected to a first terminal of a second light adjusting circuit, a fifth contact at the second side of the second mechanical switch connected to a second output terminal of the live wire and a second terminal of the second light adjusting circuit, and a sixth contact at the second side of the second mechanical switch connected to a second contact at the first side of the first mechanical switch; and
  a power drawing circuit, having a first terminal connected to the input terminal of the live wire, a second terminal connected to a second contact at the first side of the second mechanical switch, a third terminal connected to a third terminal of the first light adjusting circuit, and a fourth terminal connected to a third terminal of the second light adjusting circuit.

11. The lighting system according to claim 10, wherein both the first mechanical switch and the second mechanical switch are double-pole double-throw mechanical switches.

12. The lighting system according to claim 10, wherein when both the first mechanical switch and the second mechanical switch are off, the first contact at the first side of the first mechanical switch is connected to a fourth contact at the second side of the first mechanical switch, the second contact at the first side of the first mechanical switch is connected to a sixth contact at the second side of the first mechanical switch, the first contact at the first side of the second mechanical switch is connected to a fourth contact at the second side of the second mechanical switch, and the second contact at the first side of the second mechanical switch is connected to the sixth contact at the second side of the second mechanical switch.

13. The lighting system according to claim 10, wherein when the first mechanical switch is on and the second mechanical switch is off, the first contact at the first side of the first mechanical switch is connected to the third contact at the second side of the first mechanical switch, the second contact at the first side of the first mechanical switch is connected to the fifth contact at the second side of the first mechanical switch, the first contact at the first side of the second mechanical switch is connected to a fourth contact at the second side of the second mechanical switch, and the second contact at the first side of the second mechanical switch is connected to the sixth contact at the second side of the second mechanical switch.

14. The lighting system according to claim 10, wherein when the first mechanical switch is off and the second mechanical switch is on, the first contact at the first side of the first mechanical switch is connected to a fourth contact at the second side of the first mechanical switch, the second contact at the first side of the first mechanical switch is connected to a sixth contact at the second side of the first mechanical switch, the first contact at the first side of the second mechanical switch is connected to the third contact at the second side of the second mechanical switch, and the second contact at the first side of the second mechanical switch is connected to the fifth contact at the second side of the second mechanical switch.

15. The lighting system according to claim 10, wherein when both the first mechanical switch and the second mechanical switch are on, the first contact at the first side of the first mechanical switch is connected to the third contact at the second side of the first mechanical switch, the second contact at the first side of the first mechanical switch is connected to the fifth contact at the second side of the first mechanical switch, the first contact at the first side of the second mechanical switch is connected to the third contact at the second side of the second mechanical switch, and the second contact at the first side of the second mechanical switch is connected to the fifth contact at the second side of the second mechanical switch.

16. The lighting system according to claim 10, wherein the first output terminal of the live wire is connected to a first lamp, and the second output terminal of the live wire is connected to a second lamp.

17. The lighting system according to claim 10, wherein both the first light adjusting circuit and the second light adjusting circuit are silicon controlled circuits.

* * * * *